United States Patent
Tsang

(10) Patent No.: US 8,603,857 B2
(45) Date of Patent: Dec. 10, 2013

(54) THIN FILM TRANSISTOR FABRICATING METHOD

(75) Inventor: Jian-Shihn Tsang, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 228 days.

(21) Appl. No.: 13/308,548

(22) Filed: Dec. 1, 2011

(65) Prior Publication Data

US 2013/0078760 A1 Mar. 28, 2013

(30) Foreign Application Priority Data

Sep. 23, 2011 (TW) .............................. 100134324 A

(51) Int. Cl.
*H01L 21/34* (2006.01)
(52) U.S. Cl.
USPC ....... 438/104; 438/151; 438/795; 257/E21.46
(58) Field of Classification Search
USPC ......................................... 438/104, 151, 795
See application file for complete search history.

(56) References Cited

U.S. PATENT DOCUMENTS

| | | | |
|---|---|---|---|
| 2004/0003737 A1* | 1/2004 | Suda et al. | 101/463.1 |
| 2005/0019700 A1* | 1/2005 | Hayakawa et al. | 430/311 |
| 2010/0209294 A1* | 8/2010 | Owen et al. | 422/24 |
| 2011/0204368 A1* | 8/2011 | Tsubuku et al. | 257/59 |
| 2012/0228120 A1* | 9/2012 | Yamauchi et al. | 204/157.46 |
| 2012/0261658 A1* | 10/2012 | Akasaka et al. | 257/43 |
| 2012/0267633 A1* | 10/2012 | Hayashi et al. | 257/66 |

* cited by examiner

*Primary Examiner* — Alexander Ghyka
(74) *Attorney, Agent, or Firm* — Altis Law Group, Inc.

(57) ABSTRACT

A thin film transistor fabricating method is disclosed. The thin film transistor fabricating method comprises providing a substrate; forming an oxide semiconductor layer on an upper surface of the substrate; forming a gate insulating layer on an upper surface of the oxide semiconductor layer; masking a portion of the oxide semiconductor layer with the gate insulating layer; irradiating the oxide semiconductor layer with irradiating light having photon energy less than a band gap of the oxide semiconductor layer; forming a drain region and a source region at lateral portions of the oxide semiconductor layer exposed to the irradiating light, and forming a channel region in the portion of the oxide semiconductor layer masked by the gate insulating layer; and forming a gate electrode on an upper surface of the gate insulating layer.

15 Claims, 10 Drawing Sheets

THIN FILM TRANSISTOR FABRICATING METHOD

BACKGROUND

1. Technical Field

The disclosure generally relates to a method for fabricating a thin film transistor.

2. Description of Related Art

A typical thin film transistor includes a channel region, a source region, and a drain region formed at two opposite ends of the channel region. Generally, the source region and the drain region are formed by highly doping impurities from an upper surface of the channel region. However, the doping process is complicated and may need to be proceeded in an ion implanting apparatus, which may increase the cost of the thin film transistor.

What is needed, therefore, is a method for fabricating a thin film transistor to overcome the above described disadvantages.

DETAILED DESCRIPTION

Embodiments of a method for fabricating thin film transistors will now be described in detail below and with reference to the drawings.

Figure 1:
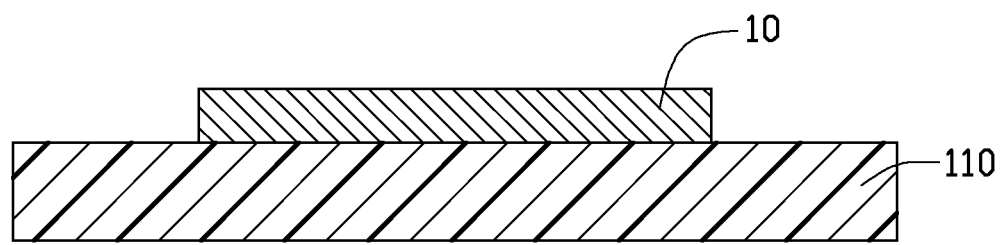
FIGS. 1-4 show steps for a method of fabricating a thin film transistor in accordance with a first embodiment of the present disclosure.

Referring to FIG. 1, an oxide semiconductor layer 10 is formed on a substrate 110. The substrate 110 is made of a material selected from a group consisting of glass, quartz, silicone, polycarbonate, polymethyl methacrylate, and metal foil. The oxide semiconductor layer 10 is made of a material selected from a group consisting of IGZO, ZnO, TiOx, GTO, GZO, AZO, IZO, ITO, ATO, $In_2O_3$, and $SnO_2$.

Figure 2:
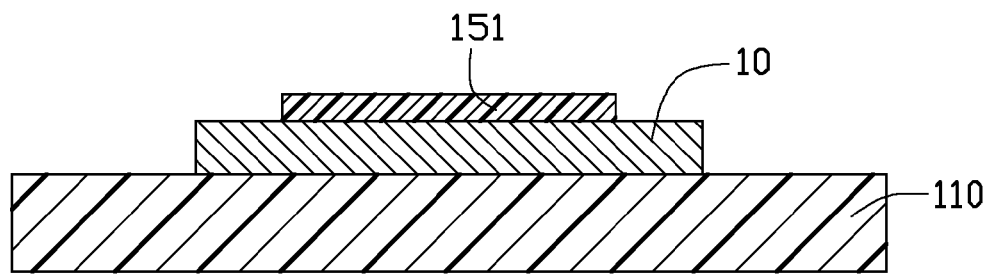

Referring to FIG. 2, a gate insulating layer 151 is formed on part of an upper surface of the oxide semiconductor layer 10. In this embodiment, the gate insulating layer 151 is positioned at a central region of the upper surface of the oxide semiconductor layer 10. The gate insulating layer 151 is made of a material selected from a group consisting of SiOx, SiNx, and SioNx.

Figure 3:
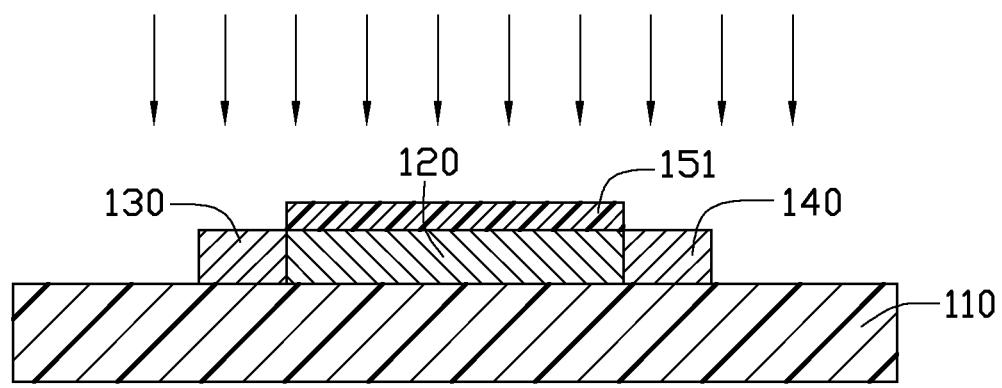

Referring to FIG. 3, with the gate insulating layer 151 functioning as a mask, the oxide semiconductor layer 10 is irradiated by irradiating light having photon energy less than a band gap of the oxide semiconductor layer 10. A source region 130 and a drain region 140 are formed respectively at lateral portions of the oxide semiconductor layer 10 exposed to the irradiating light. A channel region 120 is formed in the central portion of the oxide semiconductor layer 10 where the oxide semiconductor layer remains unexposed to the irradiating light. In alternative embodiments, the oxide semiconductor layer may be irradiated under a vacuum environment, a hydrogen environment, a nitrogen environment, or an inert gas environment. In addition, the irradiating light may be infrared rays, or far infrared rays, which have wave lengths ranged from 0.75 μm to 1000 μm. And the infrared rays or far infrared rays may be emitted by gas lasers or solid state lasers.

Figure 4:
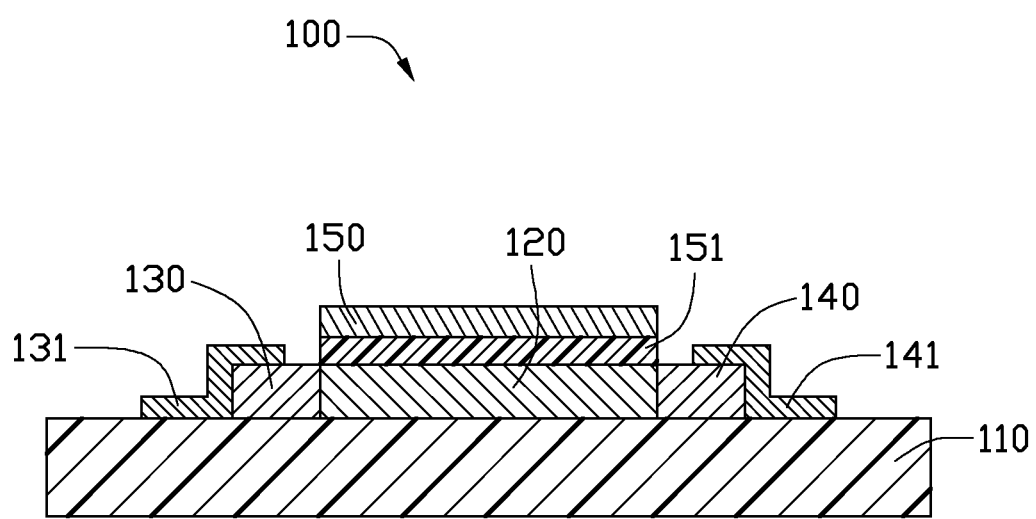

Referring to FIG. 4, a gate electrode 150 is formed on an upper surface of the gate insulating layer 151. The gate electrode 150 is positioned immediately above the gate insulating layer 151, and may be made of a material selected from a group consisting of Au, Ag, Al, Cu, Cr, and alloys thereof. When the thin film transistor 100 is in use, a voltage applied to the gate electrode 150 will control working conditions of the thin film transistor 100. For example, when the gate electrode 150 is applied with a voltage greater than a threshold voltage of the thin film transistor 100, an electrical conductive channel will be formed in the channel region 120 to connect the source region 130 with the drain region 140 which turns the thin film transistor 100 to an "on" state. When the gate electrode 150 is applied with a voltage of 0V, no electrical conductive channel will be formed in the channel region 120 which turns the thin film transistor 100 to an "off" state.

On other embodiments, a source electrode 131 and a drain electrode 141 may be further formed on upper surfaces of the source region 130 and the drain region 140, respectively. The source electrode 131 covers part of the upper surface of the source region 130 and may extend to the upper surface of the substrate 110. Similarly, the drain electrode 141 covers part of the upper surface of the drain regions 140, and may extend to the upper surface of the substrate 110. The source electrode 131 and the drain electrode 141 may be electrically connected with external power sources, thereto provide driving voltages for the thin film transistor 100.

In the method for fabricating the thin film transistor 100 described above, the oxide semiconductor layer 10 is irradiated by irradiating light having photon energy less than the band gap of the oxide semiconductor layer 10. In other words, exposed regions of the oxide semiconductor layer 10, not covered by the gate insulating layer 151, may be irradiated by the irradiating light and temperatures of the exposed regions may increase. The increasing of temperatures may increase concentrations of vacant oxygen in the exposed regions of the oxide semiconductor layer, which, in turn, may increase concentration of carriers in the exposed regions of the oxide semiconductor layer 10. As a result, the exposed regions of the oxide semiconductor 10 exposed to the irradiating light may form the source region 130 and the drain region 140. In addition, the oxide semiconductor layer 10 may be irradiated under an oxygen-lacking environment, such as a vacuum environment, a hydrogen environment, a nitrogen environment, or an inert gas environment. Under the oxygen-lacking environment, oxygen atoms may be forced to escape from the oxide semiconductor layer 10, hence concentrations of vacant oxygen in the exposed regions of the oxide semiconductor layer 10 may be increased.

It is not limited to form the gate electrode 150 on the upper surface of the channel region 120. Referring to FIG. 5-10, wherein a method for fabricating a thin film transistor 200 in accordance with a second embodiment is provided.

Figure 5:
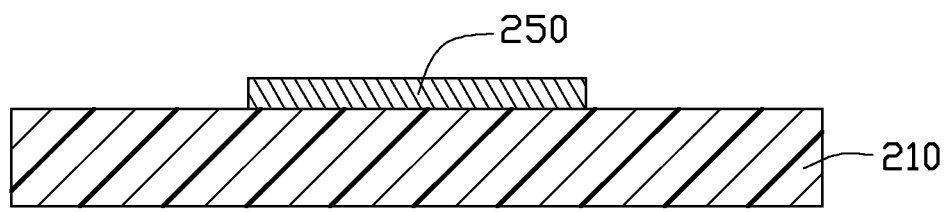
FIGS. 5-10 show steps for a method of fabricating a thin film transistor in accordance with a second embodiment of the present disclosure.

Referring to FIG. 5, a gate electrode 250 is formed on a substrate 210. The substrate 210 is made of a material selected from a group consisting of glass, quartz, silicone, polycarbonate, polymethyl methacrylate, and metal foil. The gate electrode 250 is made of a material selected from a group consisting of Au, Ag, Al, Cu, Cr, and alloys thereof.

Figure 6:
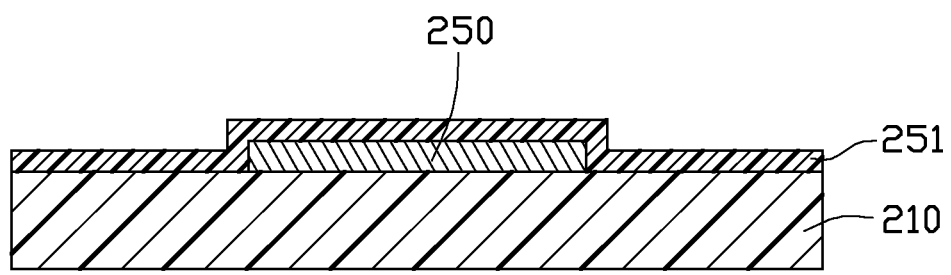

Referring to FIG. 6, a gate insulating layer 251 is formed on an upper surface of the substrate 210. The gate insulating layer 251 covers exposed surfaces of the gate electrode 250 completely. The gate insulating layer 251 is made of a material selected from a group consisting of SiOx, SiNx, and SioNx.

Figure 7:
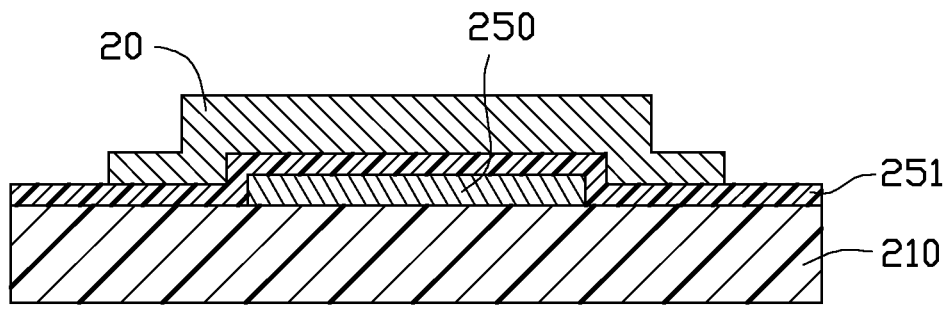

Referring to FIG. 7, an oxide semiconductor layer 20 is formed on an upper surface of the gate insulating layer 251. The oxide semiconductor layer 20 is made of a material selected from a group consisting of IGZO, ZnO, TiOx, GTO, GZO, AZO, IZO, ITO, ATO, In$_2$O$_3$, and SnO$_2$. In this embodiment, the oxide semiconductor layer 20 is positioned immediately above the gate electrode 250, and part of the oxide semiconductor layer 20 extends to a position above an upper surface of the substrate 210 which is not covered by the gate electrode 250.

Figure 8:
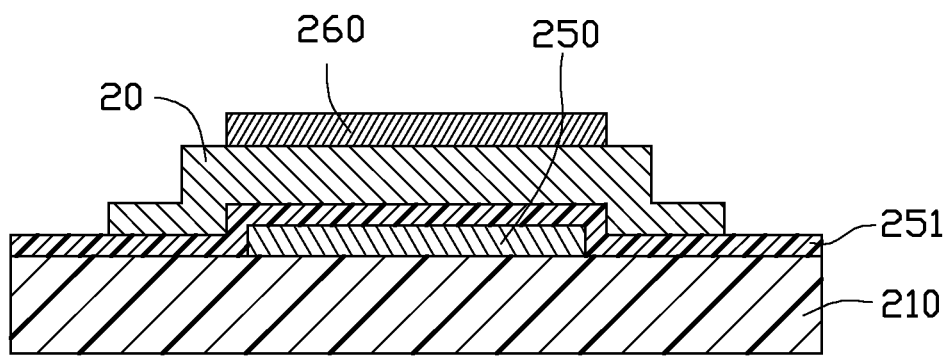

Referring to FIG. 8, an etching block layer 260 is formed on an upper surface of the oxide semiconductor layer 20 in a position immediately above the gate electrode 250. In this embodiment, the etching block layer 260 is made of SiO$_2$.

Figure 9:
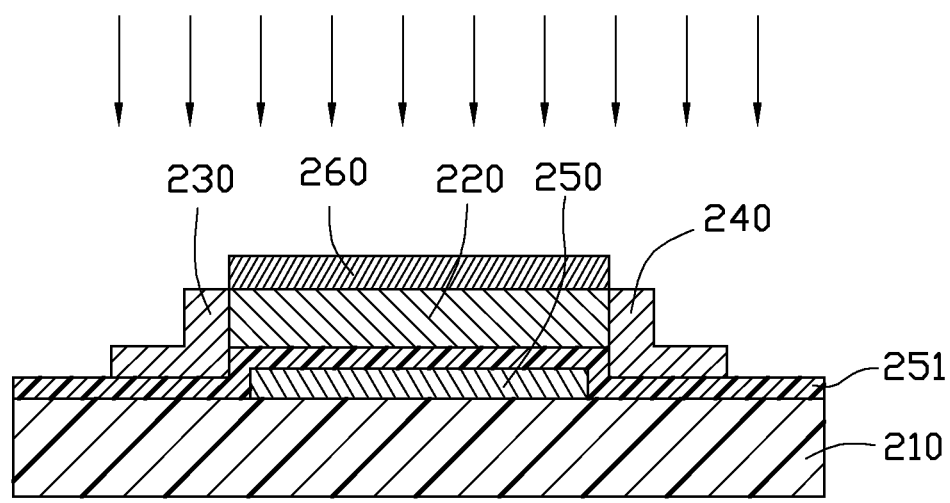

Referring to FIG. 9, with the etching block layer 260 functioning as a mask, the oxide semiconductor layer 20 is irradiated with irradiating light having photon energy less than the band gap of the oxide semiconductor layer 20. A source region 230 and a drain region 240 are formed respectively at lateral portions of the oxide semiconductor layer 20 exposed to the irradiating light. A channel region 220 is formed in the central portion of the oxide semiconductor layer 20 where the oxide semiconductor layer remains unexposed to the irradiating light. In alternative embodiments, the oxide semiconductor layer 20 may be irradiated under a vacuum environment, a hydrogen environment, a nitrogen environment, or an inert gas environment. In addition, the irradiating light may be infrared rays, or far infrared rays, which have wave lengths ranged from 0.75 µm to 1000 µm. And, the infrared rays or far infrared rays may be lasers emitted by a gas laser or a solid state laser.

Figure 10:
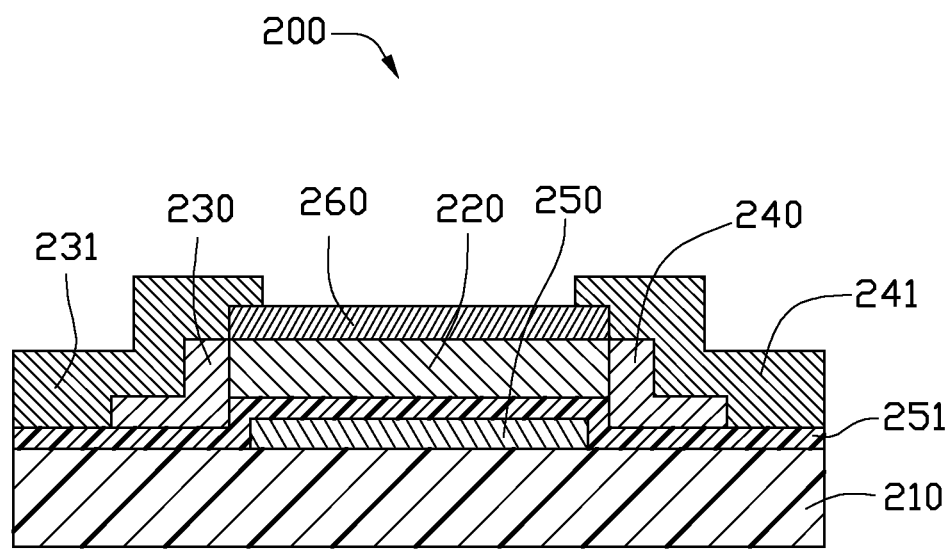

Referring to FIG. 10, a source electrode 231 and a drain electrode 241 are formed on upper surfaces of the source region 230 and the drain region 240 respectively. The source electrode 231 covers part of the upper surface of the source region 230, and extends to the upper surface of the substrate 210. Similarly, the drain electrode 241 covers part of the upper surface of the drain region 240, and the drain electrode 241 extends to the upper surface of the substrate 210. The source electrode 231 and the drain electrode 241 may be electrically connected with external power sources, thereto provide driving voltages for the thin film transistor 200.

It is to be further understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A thin film transistor fabricating method comprising:
    providing a substrate;
    forming an oxide semiconductor layer on an upper surface of the substrate;
    forming a gate insulating layer on an upper surface of the oxide semiconductor layer;
    masking a portion of the oxide semiconductor layer with the gate insulating layer;
    irradiating the oxide semiconductor layer with irradiating light having photon energy less than a band gap of the oxide semiconductor layer;
    forming a drain region and a source region at lateral portions of the oxide semiconductor layer exposed to the irradiating light, and forming a channel region in the portion of the oxide semiconductor layer masked by the gate insulating layer; and
    forming a gate electrode on an upper surface of the gate insulating layer.

2. The thin film transistor fabricating method of claim 1, wherein the oxide semiconductor layer is made of a material selected from a group consisting of IGZO, ZnO, TiOx, GTO, GZO, AZO, IZO, ITO, ATO, In$_2$O$_3$, and SnO$_2$.

3. The thin film transistor fabricating method of claim 1, wherein the oxide semiconductor layer is irradiated under a vacuum environment, a hydrogen environment, a nitrogen environment, or a inert gas environment.

4. The thin film transistor fabricating method of claim 1, wherein the oxide semiconductor layer is irradiated with infrared light, or far infrared light.

5. The thin film transistor fabricating method of claim 1, wherein the oxide semiconductor is irradiated with irradiating light emitted by a gas laser, or a solid state laser.

6. The thin film transistor fabricating method of claim 1, further comprising forming a source electrode on an upper surface of the source region, and a drain electrode on an upper surface of the drain region after forming the gate electrode on an upper surface of the gate insulating layer.

7. The thin film transistor fabricating method of claim 1, wherein the substrate is made of a material selected from a group consisting of glass, quartz, silicone, polycarbonate, polymethyl methacrylate, and metal foil.

8. The thin film transistor fabricating method of claim 1, wherein the gate electrode is made of a material selected from a group consisting of Au, Ag, Al, Cu, Cr, and alloys thereof.

9. A thin film transistor fabricating method, comprising:
    providing a substrate;
    forming a gate electrode on an upper surface the substrate;
    forming a gate insulating layer on an upper surface of the substrate, the gate insulating layer completely covering exposed surfaces of the gate electrode;
    forming an oxide semiconductor layer on an upper surface of the gate insulating layer;
    forming an etching block layer on an upper surface of the oxide semiconductor layer at a position immediately above the gate electrode;
    masking a portion of the semiconductor layer with the etching block layer;
    irradiating the oxide semiconductor layer with irradiating light having photon energy less than a band gap of the oxide semiconductor layer; and
    forming a drain region and a source region at lateral portions of the oxide semiconductor layer exposed to the irradiating light, and forming a channel region in the portion of the oxide semiconductor layer masked by the gate insulating layer.

10. The thin film transistor fabricating method of claim 9, wherein the oxide semiconductor layer is made of a material selected from a group consisting of IGZO, ZnO, TiOx, GTO, GZO, AZO, IZO, ITO, ATO, In$_2$O$_3$, and SnO$_2$.

11. The thin film transistor fabricating method of claim 9, wherein the oxide semiconductor layer is irradiated under a vacuum environment, a hydrogen environment, a nitrogen environment, or a inert gas environment.

12. The thin film transistor fabricating method of claim 9, wherein the oxide semiconductor layer is irradiated with irradiating light emitted by a gas laser, or a solid state laser.

13. The thin film transistor fabricating method of claim 9, further comprising forming a source electrode on an upper surface of the source region, and a drain electrode on an upper surface of the drain region after the forming of the drain region and the source region.

14. The thin film transistor fabricating method of claim 9, wherein the substrate is made of a material selected from a group consisting of glass, quartz, silicone, polycarbonate, polymethyl methacrylate, and metal foil.

15. The thin film transistor fabricating method of claim 9, wherein the gate electrode is made of a material selected from a group consisting of Au, Ag, Al, Cu, Cr, and alloys thereof.

* * * * *